(12) United States Patent
Fry et al.

(10) Patent No.: US 7,073,145 B2
(45) Date of Patent: Jul. 4, 2006

(54) PROGRAMMABLE DELAY METHOD FOR HIERARCHICAL SIGNAL BALANCING

(75) Inventors: Thomas W. Fry, Cambridge, MA (US); Daniel R. Menard, Arlington, MA (US); Phillip Paul Normand, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 10/248,301

(22) Filed: Jan. 7, 2003

(65) Prior Publication Data

US 2004/0133864 A1 Jul. 8, 2004

(51) Int. Cl.
*G06F 17/50* (2006.01)
(52) U.S. Cl. .................... 716/6; 716/2; 716/12; 716/17
(58) Field of Classification Search ................. 326/41, 326/93; 716/2, 5, 12, 17, 1, 6; 713/401
See application file for complete search history.

(56) References Cited

U.S. PATENT DOCUMENTS

| 5,655,113 A * | 8/1997 | Leung et al. ............... 713/401 |
| 5,686,845 A * | 11/1997 | Erdal et al. .................... 326/93 |
| 5,712,583 A | 1/1998 | Frankeny ..................... 727/277 |
| 5,812,832 A | 9/1998 | Horne ......................... 713/501 |
| 5,878,055 A | 3/1999 | Allen .......................... 714/744 |
| 5,900,762 A | 5/1999 | Ramakrishnan ............. 327/277 |
| 5,912,820 A | 6/1999 | Kerzman et al. ............... 716/6 |
| 6,091,261 A | 7/2000 | De Lange ..................... 326/38 |
| 6,127,844 A | 10/2000 | Cliff et al. .................... 326/41 |
| 6,421,818 B1 | 7/2002 | Dupenloup et al. ........... 716/18 |
| 6,453,402 B1 | 9/2002 | Jeddeloh ..................... 711/167 |
| 6,577,992 B1 | 6/2003 | Tchernlaev et al. ........... 703/14 |
| 6,687,889 B1 | 2/2004 | Secatch et al. ................ 716/6 |
| 6,693,456 B1 * | 2/2004 | Wong .......................... 326/41 |
| 6,711,716 B1 * | 3/2004 | Mueller et al. ................ 716/1 |
| 2002/0073389 A1 * | 6/2002 | Elboim et al. ................ 716/6 |
| 2003/0009734 A1 | 1/2003 | Burks et al. .................. 716/6 |

OTHER PUBLICATIONS

Carrig et al., "A New Direction In ASIC High-Performance Clock Methodology", IEEE 1998 Custom ICs Conference, pp. 593-596.
Harris et al., "Statistical Clock Skew Modeling With Data Dealy Variations", IEEE Trans on VLSI Systems, vol. 9, No. 6, Dec. 2001, pp. 888-898.
Jex et al., "High Speed I/O Circuit Design in Multiple Voltage Domains", 1999 IEEE, pp. 424-427.

* cited by examiner

*Primary Examiner*—Thuan Do
(74) *Attorney, Agent, or Firm*—Richard M. Kotulak (57) ABSTRACT

A method for signal balancing across multiple random logic macros. The method inserts a programmable delay element into the design before the last buffer level on all signal paths. The random logic macro is then fully designed including cell placement and wiring. With programmable delay buffers in place, the random logic macros may be used within multiple designs, each having varying signal latency requirements.

6 Claims, 4 Drawing Sheets

PROGRAMMABLE DELAY METHOD FOR HIERARCHICAL SIGNAL BALANCING

BACKGROUND OF THE INVENTION

1. Field of the Invention

This invention relates to signal balancing in integrated circuits. More particularly it relates to signal balancing in system on chip integrated circuits. More specifically, it applies to balancing signal arrival time in IC designs between multiple random logic macros (RLM).

2. Background of the Invention

Currently, in order to balance signal arrival times between multiple RLMs, designers manually add buffers and make wiring adjustments by hand to adjust the signal's latency both within each RLM and at the top level of a design. Such a method is undesirable for the following reasons:

1) Adding the proper amount of delay buffers and adjusting wire delays greatly increases Turn Around Time (TAT);

2) When designing signal paths within each RLM, consideration must be taken to match other RLM's latencies;

3) RLM reuse between individual designs is complicated;

4) Any modification to a RLM or the top level of a design effects the entire signal path, possibly requiring the signal to be rebalanced, wasting previous manual efforts; and 5) Re-balancing a hierarchical clock tree involves discarding previous manual efforts and restarting adjustments.

Large variations in RLM size/load count result in large signal latency variations within RLMs.

One possible solution to this problem is to actually implement programmable delay logic into the integrated circuit itself. Once the integrated circuit is manufactured, the delays are calculated and actual delay logic can then be fixed. Of course, this approach has the attendant problems relating to having to design-in additional logic that would otherwise be unnecessary.

BRIEF SUMMARY OF THE INVENTION

This inventions automates signal balancing across multiple RLMs, thus reducing manual design efforts and decreasing turn-around-time. The method inserts a programmable delay element into the design before the last buffer level on all signal paths. The RLM is then fully designed including cell placement and wiring. With programmable delay buffers in place, the RLM may be used within multiple designs, each having varying signal latency requirements.

Then in each individual design, the programmable delay elements are automatically adjusted to match signal latency across every path of the specific design. The method adjusts the latency of each signal branch across the entire design without adding or deleting delay cells or rewiring, to fabrication the programmable delay element's functionality is fixed turning them into fixed, unadjustable delay blocks. In doing so the programmable delay elements are used solely as a design aid and are not re-programmable post fabrication. Using programmable delay elements to balance signal latency across RLMs is advantageous for the following reasons:

â€¢RLM design is independent both of other RLMs and the current chip;

â€¢Signal latency across each RLM is automatically adjusted in 30 ps steps without (significant) physical modifications;

â€¢Modifications to the top level design or any RLM do not effect placement or wiring in other RLMs;

â€¢Signal arrival times are readjusted automatically by software tools without manual effort;

â€¢Signal balancing may be further refined post wiring using full 3D parasitic extraction data;

â€¢Supports RLMs with a varying number of buffer levels; and

â€¢Maintains tight skew within a single RLM.

DETAILED DESCRIPTION OF THE INVENTION

Traditionally signal balancing in hierarchical designs is performed by one of two main approaches:

1) Designing each RLM to have a single common signal latency.

There are two primary drawbacks to designing/planning RLMs to have a common signal latency. First, achieving a specific latency target is difficult and typically requires extensive manual effort increasing design turnaround time. Second, RLM reuse is complicated since every design has varying signal latency requirements.

2) Flattening (i.e. removing all hierarchy) from the design in order to process a balanced signal as a regular design.

Loses all the advantages of the hierarchical design approach including allowing several designers to process separate design components in parallel. The software speed up of processing smaller design segments at a single time is lost. In addition, tight intra-RLM skew is reduced which is one of the most important characteristics of a hierarchical signal.

In this invention signals are designed and delay balanced using standard techniques with one difference. A programmable delay element is inserted along each signal path from the signal's source to each balanced timing point in both the RLMs and the top level of the design. The employees the programmable delay elements solely as a design aid. Prior to fabrication the programmable inputs to the programmable delay elements are wired to Vdd and GND, fixing their functionality and converting the programmable elements into fixed delay elements where each delay element provides the exact amount of delay required for the current RLM.

Figure 1:
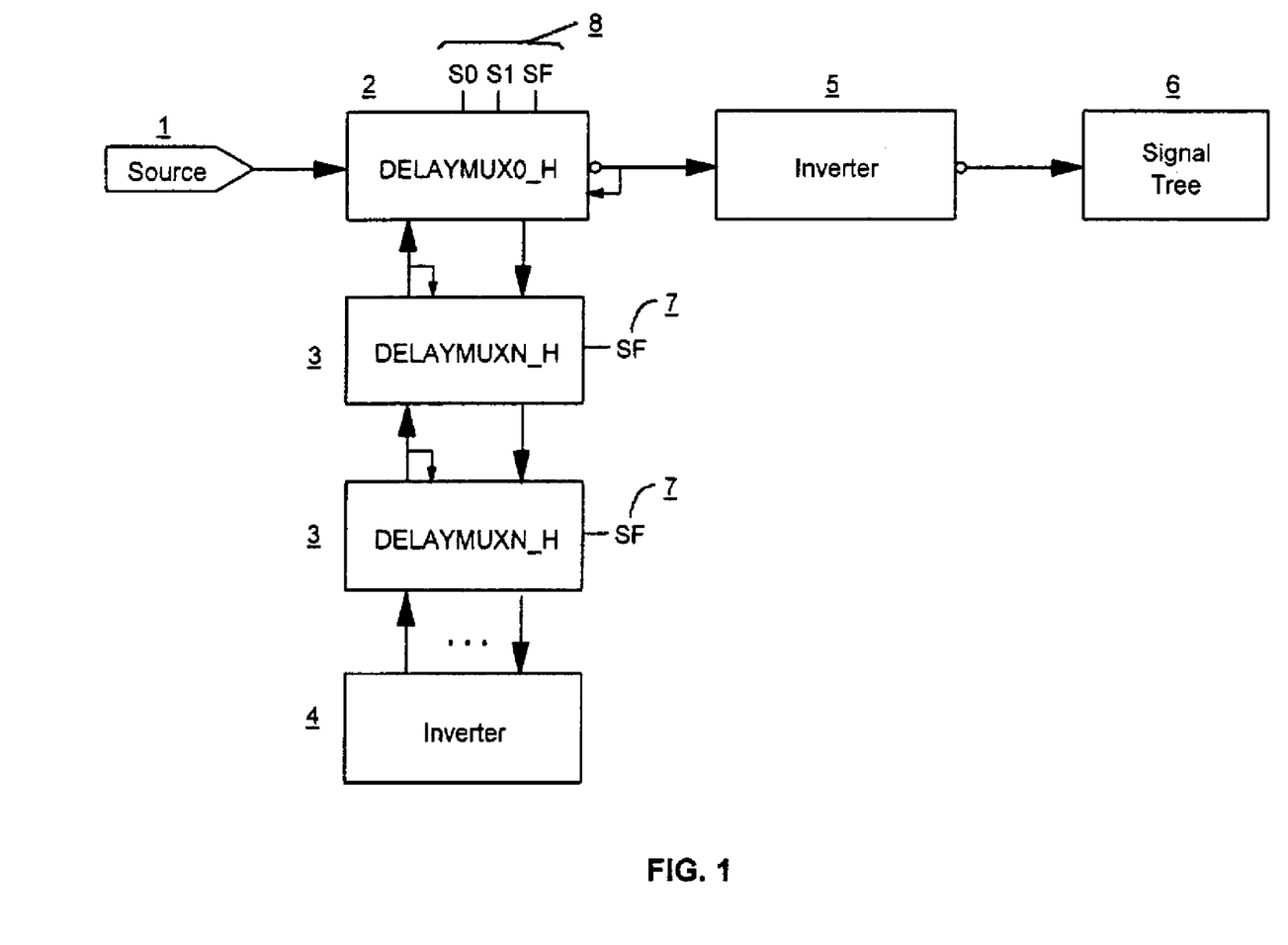
FIG. 1 is a block diagram which illustrates in schematic form a programmable delaymux chain.

As illustrated in FIG. 1 a programmable delay element consists of the serial chain of delaymux cells 2 and 3 which presumably are available ASIC standard cell library and terminated by an inverter 4. It is important to note the inventive method described herein can use any type of programmable delay element, the delaymux chain used represents just one possible embodiment. The signal delay through the delaymux chain depends on the programmable inputs to the chain 7 and 8. An inverter is inserted following the delaymux chain 5. The inverter servers two purposes: 1) it restores the polarity of the signal and 2) provides the required re-powering to drive the next cell without impacting cell 2. By reprogramming inputs 7 and 8 it is possible to adjust and fine tune the latency of the overall signal path from 1 to 6 without making physical modifications to the design.

Figure 2:
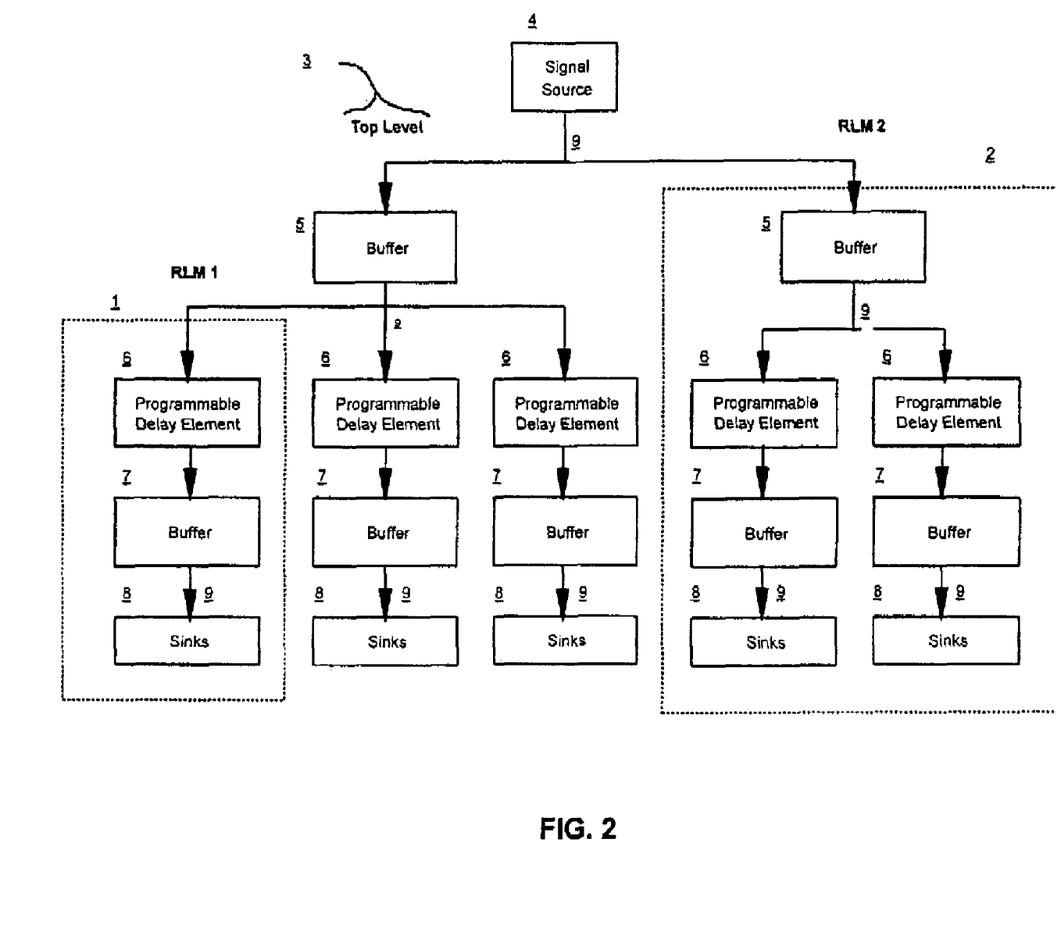
FIG. 2 is a block diagram which illustrates in schematic form a balancing signal's structure.

To support RLMs with varying number of buffer levels, the methodology inserts programmable delaymux chains only before the last buffer level of both the top design level and each RLM. Every RLM is tapped into the top design level at a branch appropriate for the number of buffer levels within the RLM. FIG. 2 shows an example of a signal balanced throughout an entire design. RLM 1 contains only one buffer level 7 and is attached to the first buffer stage in the top design level, buffer 5. RLM 2 requires two buffer levels 5 and 7 to re-power the signal and is attached to the second buffer stage, buffer 4. By inserting programmable delay elements 6 and attaching RLMs 1 and 2 at an appropriate buffer level, the signal to be balanced shares a common structure spanning the entire design and each branch is physically identical. For any sink 8 driven, whether the sink exists in RLM 1 or 2 or the top design level 3, the signal is driven by a common number of stages 4, 5 and 7, one programmable delay element 6 and balance wiring 9.

The common structure serves two purposes: First, since there are an identical number of buffers throughout each signal branch, regardless as to which portions exist in an RLM or the top design level, the signal is naturally balanced within a gross amount of latency, even before adjusting the programmable delay elements. Second, every programmable delay element is inserted at an identical buffer level which provides an automated tool the ability to adjust each branch independently while attempting to globally balance the signal.

In order to globally balance a signal, placement and balance wiring is performed by employing standard balancing methods identical to a traditional (non-hierarchical) design within each RLM and the top level. Once complete, the sinks of a signal are optimally balanced within each RLM. However since each RLM is processed separately, significant inter-RLM skew will develop due to the variable signal latency of each RLM. To compensate for the latency mismatch and globally balance the signal, automated software tools adjust the delay of each programmable delaymux chain. Since there is one programmable delay chain along each path, every path is ensured to be adjustable. The final result is a globally balanced signal.

To automatically program the delaymux chains and globally balance the signal, software balancing tools were developed for use within the design environment. The algorithm function as follows. The tool scans the signal throughout all levels of hierarchy from the source to each sink, 4, 5, 6, 7 and 8 in FIG. 2, while storing the number of levels and position of each programmable element 6. Each delaymux chain identified is reset to the minimum latency and the entire signal path is timed. The signal branch with the longest delay is selected as the target latency for every other branch. Next the algorithm identifies the buffer level 6 where every branch of the signal contains a delaymux chain. Each delaymux chain's latency is iteratively increased by the smallest amount possible until the latency matching the target as close as possible is discovered. Lastly the tool asserts an attribute which is used by later tools to both time the design and identify how to program each delaymux cell. Appendix 1 displays a sample balancing run along with program input and output.

Another advantage of this method is it is now possible to re-balance and fine tune each signal path after a design is fully wired. Normally, a global signal is balanced prior to wiring the design to provide the greatest amount of design freedom. Yet due to 3D adjacency effects, wires inserted post balancing impact the balanced signal and add additional skew. However, since programmable delay elements allow the latency of each signal branch to be adjusted without physical modifications, it is now possible to re-balance the signal after the design is fully wired.

Figure 3:
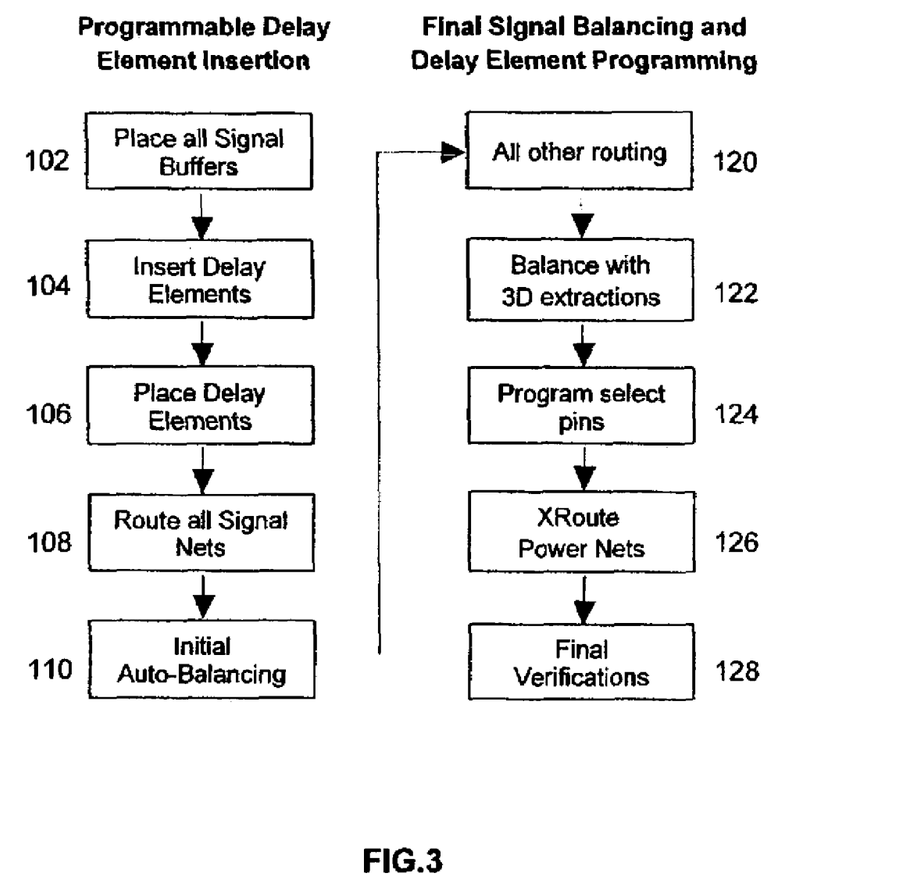
FIG. 3 is a block diagram which illustrates in flow chart form the balancing method of this invention.

FIG. 3 outlines the methodology's steps. First buffers are inserted and placed (102) followed by inserting one delaymux chain for each signal branch (104 and 106). Next in every RLM the signal is balanced wired (108) to independently balance the signal within each RLM and provide good intra-RLM skew. Next software tools automatically globally balance the signal across the entire design (110). At this point the signal is balanced for timing purposes but is not fixed yet. The designer then completes the rest of the design flow and generates full 3D parasitics once the design is completed (120). With full 3D parasitics, the automated software tools are run a final time (122) to provide a final signal balancing. Once the signal is balanced the programmable pins on each delaymux cell are wired to Vdd and GND (124). Doing so locks in the latency of each programmable delaymux chain and converts the programmable delay elements into fixed blocks of delay optimized for each individual signal branch and power nets are routed (126). Once complete the design is passed off for final verifications and checking and sent to manufacturing (128).

Figure 4:
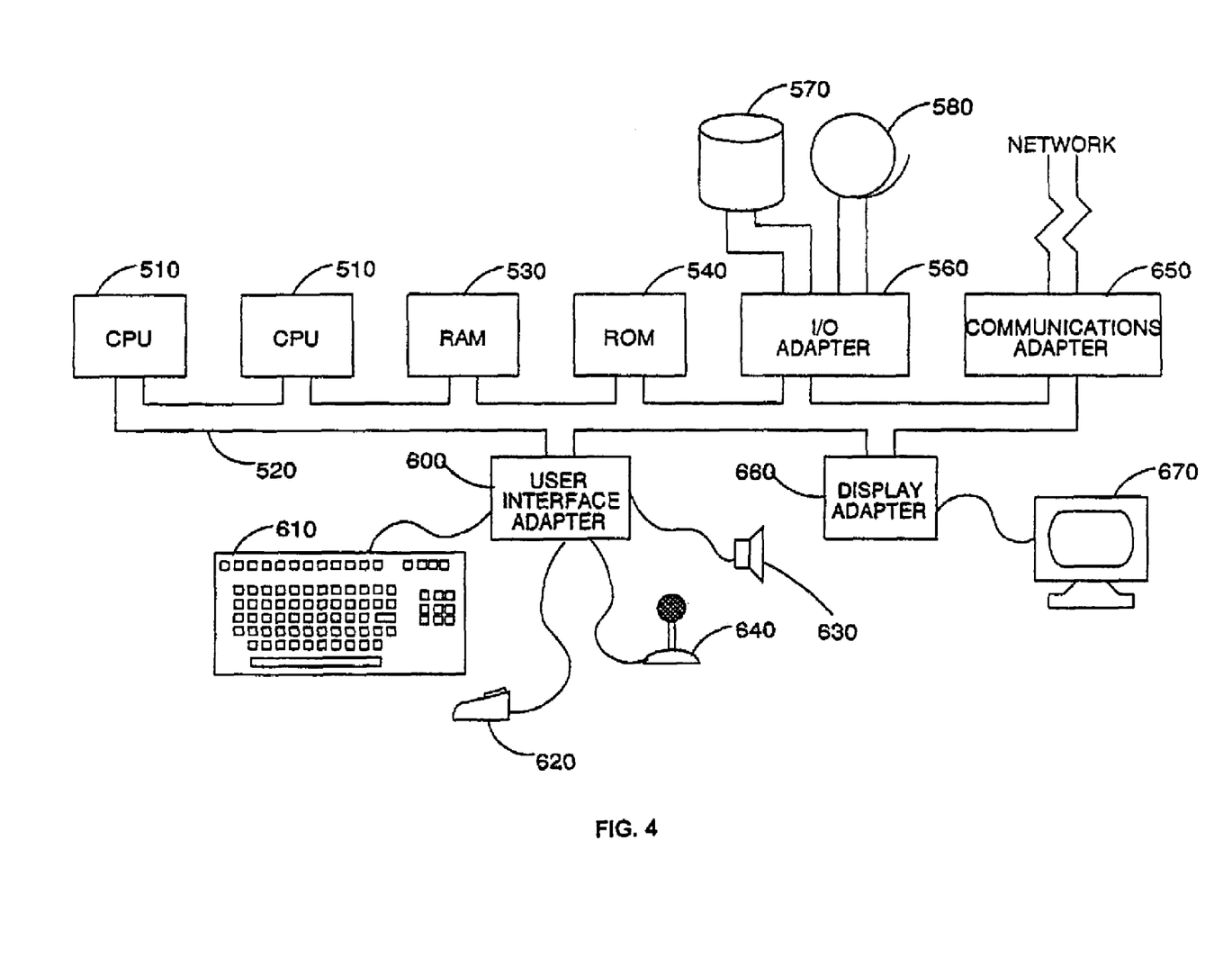
FIG. 4 is a diagram in schematic form that represents a typical computer system hardware environment for practicing this invention.

A representative hardware environment for practicing the present invention is depicted in FIG. 4, which illustrates the typical hardware configuration of a computer system capable of performing the signal balancing in accordance with the present invention. The typical environment has at least one processor or central processing unit (CPU) 510. CPUs 510 are interconnected via system bus 520 to a random access memory (RAM) 530, read-only memory (ROM) 540, an input/output (I/O) adapter 560 for connecting peripheral devices such as disk units 570 and tape drives 580 to bus 520, user interface adapter 600 for connecting keyboard 610, mouse 620, speaker 630, microphone 640, and/or other user interface devices such as touch screen device (not shown) to bus 520, communication adapter 650 for connecting the information handling system to a data processing network, and display adapter 660 for connecting bus 520 to display device 670. The design system comprising the design information needed for this invention, libraries, balancing code, simulation and verification software can be loaded on the appropriate disk or tape units or fed either through I/O adapters or the network for processing. A computer program with an appropriate application interface could be created by one of skill in the art and stored on the system to simplify the practicing of this invention.

It is thus believed that the operation and construction of the present invention will be apparent from the foregoing description. The description of the embodiments of the present invention is given above for the understanding of the present invention. It will be understood that the invention is not to the particular embodiments described herein, but is capable of various modifications, rearrangements and substitutions will now become apparent to those skilled in the art without departing from the scope of the invention. Therefore it is intended that the following claims cover all such modifications and changes as fall within the true spirit and scope of the invention.

Appendix 1: Example Balancing run:

```
chipbench> clk::balance_levels -h
[clk-91003]: balance_levels: Compiled on Dec  2 2002 at 02:28:50
[Ci-2]: Usage for command "clk::balance_levels"    () = required, [] = optional
    [ -root STRING ]
    [ -fall | -rise ]
    [ -early | -late ]
    [ -balance_at | -balance_latency ]
    [ -skip | -no_skip ]
    [ -frequency DOUBLE ]
    [ -slew DOUBLE ]
    [ -skip_ldr_latches | -no_skip_ldr_latches ]
    [ -consider_fixed_paths | -no_consider_fixed_paths ]
    [ -print_levels | -no_print_levels ]

chipbench> clk::balance_levels -root clk -rise -early -balance_at
[clk-91003]: balance_levels: Compiled on Dec  2 2002 at 02:28:50
[clk-91349]: Level Report For Clock Net: clk
[clk-91343]:
[clk-91352]: Processing Level: 4 Interation: 1
[clk-91343]:
[clk-91350]: Level     Pin Name                          Max AT          Min AT          AT Mid-Point
[clk-91347]: -----------------------------------------------------------------------------------------
[clk-91351]: 4         rlm1/clkin_box_1_1.A              2.549275        2.466544        2.507910
[clk-91351]: 4         rlm4/clkin_box_1_1.A              1.996570        1.969115        1.982843
[clk-91351]: 4         clk_box_1_1.A                     2.344189        2.251259        2.297724
[clk-91351]: 4         rlm2/clkin_box_1_1.A              2.238719        2.208114        2.223417
[clk-91351]: 4         rlm3/clkin_box_1_1.A              2.217807        2.191263        2.204535
[clk-91343]:
[clk-91348]: Non Adjustable Max: 2.516026 Min: 1.982843 - Adjustable Max: 0.000000 Min: 16.000000
[clk-91348]: Target a latency of: 0.000000
[clk-91343]:
[clk-91348]:
[clk-91348]: Completed level 4
[clk-91343]:
[clk-91352]: Processing Level: 3 Interation: 1
[clk-91343]:
[clk-91350]: Level     Pin Name                          Max AT          Min AT          AT Mid-Point
[clk-91347]: -----------------------------------------------------------------------------------------
[clk-91351]: 3         rlm1/clkin_box_1_1_delay_inv.A    2.549275        2.466544        2.507910
[clk-91351]: 3         rlm4/clkin_box_1_1_delay_inv.A    1.996570        1.969115        1.982843
[clk-91351]: 3         clk_box_1_1_delay_inv.A           2.344189        2.251259        2.297724
[clk-91351]: 3         rlm2/clkin_box_1_1_delay_inv.A    2.238719        2.208114        2.223417
[clk-91351]: 3         rlm3/clkin_box_1_1_delay_inv.A    2.217807        2.191263        2.204535
[clk-91343]:
[clk-91348]: Non Adjustable Max: 2.516026 Min: 1.982843 - Adjustable Max: 0.000000 Min: 16.000000
[clk-91348]: Target a latency of: 0.000000
[clk-91343]:
[clk-91343]:
[clk-91348]: Completed level 3
[clk-91343]:
[clk-91348]: Resetting delay muxes on net clkin_net_2_1 - pin clkin_box_1_1_delay_0.DF
[clk-91348]: Resetting delay muxes on net clkin - pin clkin_box_1_1_delay_0.DF
[clk-91348]: Resetting delay muxes on net clk_net_2_4 - pin clk_box_1_1_delay_0.DF
[clk-91348]: Resetting delay muxes on net clkin_net_2_1 - pin clkin_box_1_1_delay_0.DF
[clk-91348]: Resetting delay muxes on net clkin_net_2_1 - pin clkin_box_1_1_delay_0.DF
[clk-91352]: Processing Level: 2 Interation: 1
[clk-91343]:
[clk-91350]: Level     Pin Name                          Max AT          Min AT          AT Mid-Point
[clk-91347]: -----------------------------------------------------------------------------------------
[clk-91351]: 2         rlm1/clkin_box_1_1_delay_0.DF     2.549275        2.466544        2.507910
[clk-91351]: 2         rlm4/clkin_box_1_1_delay_0.DF     1.996570        1.969115        1.982843
[clk-91351]: 2         clk_box_1_1_delay_0.DF            2.344189        2.251259        2.297724
[clk-91351]: 2         rlm2/clkin_box_1_1_delay_0.DF     2.238719        2.208114        2.223417
[clk-91351]: 2         rlm3/clkin_box_1_1_delay_0.DF     2.217807        2.191263        2.204535
[clk-91343]:
[clk-91348]: Non Adjustable Max: 0.000000 Min: 16.000000 - Adjustable Max: 2.516026 Min: 1.982843
[clk-91348]: Target a latency of: 2.516026
[clk-91343]:
[clk-91353]: Increasing the delay for clkin_box_1_1_delay_0.DF
[clk-91353]: Increasing the delay for clkin_box_1_1_delay_0.DF
```

[0041]

```
[clk-91353]: Increasing the delay for clk_box_1_1_delay_0.DF
[clk-91353]: Increasing the delay for clkIn_box_1_1_delay_0.DF
[clk-91353]: Increasing the delay for clkin_box_1_1_delay_0.DF
[clk-91343]:
[clk-91352]: Processing Level: 2 Interation: 2
[clk-91343]:
[clk-91350]: Level    Pin Name                          Max AT       Min AT       AT Mid-Point
[clk-91347]: =====================================================================================
[clk-91351]: 2        rlm1/clkin_box_1_1_delay_0.DF     2.580954     2.498223     2.539588
[clk-91351]: 2        rlm4/clkin_box_1_1_delay_0.DF     2.027818     2.000364     2.014091
[clk-91351]: 2        clk_box_1_1_delay_0.DF            2.373956     2.281026     2.327491
[clk-91351]: 2        rlm2/clkin_box_1_1_delay_0.DF     2.266939     2.236334     2.251637
[clk-91351]: 2        rlm3/clkin_box_1_1_delay_0.DF     2.246058     2.219514     2.232786
[clk-91343]:
[clk-91348]: Non Adjustable Max: 0.000000 Min: 16.000000 - Adjustable Max: 2.543985 Min: 2.014091
[clk-91346]: Target a latency of: 2.516026
[clk-91343]:
[clk-91356]: Decreasing the delay for clkin_box_1_1_delay_0.DF
[clk-91353]: Increasing the delay for clkin_box_1_1_delay_0.DF
[clk-91353]: Increasing the delay for clk_box_1_1_delay_0.DF
[clk-91353]: Increasing the delay for clkin_box_1_1_delay_0.DF
[clk-91353]: Increasing the delay for clkin_box_1_1_delay_0.DF
[clk-91343]:
[clk-91352]: Processing Level: 2 Interation: 3
[clk-91343]:
[clk-91350]: Level    Pin Name                          Max AT       Min AT       AT Mid-Point
[clk-91347]: =====================================================================================
[clk-91351]: 2        rlm1/clkin_box_1_1_delay_0.DF     2.549275     2.466544     2.507910
[clk-91351]: 2        rlm4/clkin_box_1_1_delay_0.DF     2.059837     2.032383     2.046110
[clk-91351]: 2        clk_box_1_1_delay_0.DF            2.404977     2.312047     2.358512
[clk-91351]: 2        rlm2/clkin_box_1_1_delay_0.DF     2.296824     2.266219     2.281521
[clk-91351]: 2        rlm3/clkin_box_1_1_delay_0.DF     2.275576     2.249032     2.262304
[clk-91343]:
[clk-91348]: Non Adjustable Max: 0.000000 Min: 16.000000 - Adjustable Max: 2.542130 Min: 2.046110
[clk-91346]: Target a latency of: 2.516026
[clk-91343]:
[clk-91353]: Increasing the delay for clkin_box_1_1_delay_0.DF
[clk-91353]: Increasing the delay for clk_box_1_1_delay_0.DF
[clk-91353]: Increasing the delay for clkin_box_1_1_delay_0.DF
[clk-91353]: Increasing the delay for clkin_box_1_1_delay_0.DF
[clk-91343]:
[clk-91352]: Processing Level: 2 Interation: 4
[clk-91343]:
[clk-91350]: Level    Pin Name                          Max AT       Min AT       AT Mid-Point
[clk-91347]: =====================================================================================
[clk-91351]: 2        rlm1/clkin_box_1_1_delay_0.DF     2.549275     2.466544     2.507910
[clk-91351]: 2        rlm4/clkin_box_1_1_delay_0.DF     2.090042     2.062588     2.076315
[clk-91351]: 2        clk_box_1_1_delay_0.DF            2.434136     2.341206     2.387671
[clk-91351]: 2        rlm2/clkin_box_1_1_delay_0.DF     2.325177     2.294572     2.309875
[clk-91351]: 2        rlm3/clkin_box_1_1_delay_0.DF     2.304579     2.278035     2.291307
[clk-91343]:
[clk-91348]: Non Adjustable Max: 0.000000 Min: 16.000000 - Adjustable Max: 2.541589 Min: 2.076315
[clk-91346]: Target a latency of: 2.516026
[clk-91343]:
[clk-91353]: Increasing the delay for clkin_box_1_1_delay_0.DF
[clk-91353]: Increasing the delay for clk_box_1_1_delay_0.DF
[clk-91353]: Increasing the delay for clkin_box_1_1_delay_0.DF
[clk-91353]: Increasing the delay for clkin_box_1_1_delay_0.DF
[clk-91343]:
[clk-91352]: Processing Level: 2 Interation: 5
[clk-91343]:
[clk-91350]: Level    Pin Name                          Max AT       Min AT       AT Mid-Point
[clk-91347]: =====================================================================================
[clk-91351]: 2        rlm1/clkin_box_1_1_delay_0.DF     2.549275     2.466544     2.507910
[clk-91351]: 2        rlm4/clkin_box_1_1_delay_0.DF     2.138269     2.110815     2.124542
[clk-91351]: 2        clk_box_1_1_delay_0.DF            2.483755     2.390825     2.437290
[clk-91351]: 2        rlm2/clkin_box_1_1_delay_0.DF     2.376173     2.345569     2.360871
[clk-91351]: 2        rlm3/clkin_box_1_1_delay_0.DF     2.352011     2.326267     2.339539
[clk-91343]:
[clk-91348]: Non Adjustable Max: 0.000000 Min: 16.000000 - Adjustable Max: 2.564754 Min: 2.124542
[clk-91346]: Target a latency of: 2.516026
[clk-91343]:
[clk-91353]: Increasing the delay for clkin_box_1_1_delay_0.DF
[clk-91353]: Increasing the delay for clk_box_1_1_delay_0.DF
[clk-91353]: Increasing the delay for clkin_box_1_1_delay_0.DF
[clk-91353]: Increasing the delay for clkin_box_1_1_delay_0.DF
[clk-91343]:
[clk-91352]: Processing Level: 2 Interation: 6
[clk-91343]:
[clk-91350]: Level    Pin Name                          Max AT       Min AT       AT Mid-Point
[clk-91347]: =====================================================================================
[clk-91351]: 2        rlm1/clkin_box_1_1_delay_0.DF     2.549275     2.466544     2.507910
[clk-91351]: 2        rlm4/clkin_box_1_1_delay_0.DF     2.176867     2.149412     2.163139
[clk-91351]: 2        clk_box_1_1_delay_0.DF            2.521023     2.428093     2.474558
[clk-91351]: 2        rlm2/clkin_box_1_1_delay_0.DF     2.411902     2.381298     2.396600
[clk-91351]: 2        rlm3/clkin_box_1_1_delay_0.DF     2.388195     2.361651     2.374923
[clk-91343]:
```

[0042]

```
[clk-91348]: Non Adjustable Max: 0.000000 Min: 16.000000 - Adjustable Max: 2.549019 Min: 2.163139
[clk-91348]: Target a latency of: 2.516026
[clk-91343]:
[clk-91353]: Increasing the delay for clkin_box_1_1_delay_0.DF
[clk-91353]: Increasing the delay for clk_box_1_1_delay_0.DF
[clk-91353]: Increasing the delay for clkin_box_1_1_delay_0.DF
[clk-91353]: Increasing the delay for clkin_box_1_1_delay_0.DF
[clk-91343]:
[clk-91352]: Processing Level: 2 Interation: 7
[clk-91343]:
[clk-91350]: Level    Pin Name                              Max AT        Min AT        AT Mid-Point
[clk-91347]: -----------------------------------------------------------------------------------------
[clk-91351]: 2        rlm1/clkin_box_1_1_delay_0.DF         2.549275      2.466544      2.507910
[clk-91351]: 2        rlm4/clkin_box_1_1_delay_0.DF         2.218393      2.190939      2.204666
[clk-91351]: 2        clk_box_1_1_delay_0.DF                2.561445      2.468516      2.514981
[clk-91351]: 2        rlm2/clkin_box_1_1_delay_0.DF         2.451163      2.420559      2.435861
[clk-91351]: 2        rlm3/clkin_box_1_1_delay_0.DF         2.427557      2.401013      2.414285
[clk-91343]:
[clk-91348]: Non Adjustable Max: 0.000000 Min: 16.000000 - Adjustable Max: 2.533731 Min: 2.204666
[clk-91348]: Target a latency of: 2.516026
[clk-91343]:
[clk-91353]: Increasing the delay for clkin_box_1_1_delay_0.DF
[clk-91353]: Increasing the delay for clk_box_1_1_delay_0.DF
[clk-91353]: Increasing the delay for clkin_box_1_1_delay_0.DF
[clk-91353]: Increasing the delay for clkin_box_1_1_delay_0.DF
[clk-91343]:
[clk-91352]: Processing Level: 2 Interation: 8
[clk-91343]:
[clk-91350]: Level    Pin Name                              Max AT        Min AT        AT Mid-Point
[clk-91347]: -----------------------------------------------------------------------------------------
[clk-91351]: 2        rlm1/clkin_box_1_1_delay_0.DF         2.549275      2.466544      2.507910
[clk-91351]: 2        rlm4/clkin_box_1_1_delay_0.DF         2.255612      2.228158      2.241885
[clk-91351]: 2        clk_box_1_1_delay_0.DF                2.598006      2.505076      2.551541
[clk-91351]: 2        rlm2/clkin_box_1_1_delay_0.DF         2.487434      2.456830      2.472132
[clk-91351]: 2        rlm3/clkin_box_1_1_delay_0.DF         2.464955      2.438412      2.451684
[clk-91343]:
[clk-91348]: Non Adjustable Max: 0.000000 Min: 16.000000 - Adjustable Max: 2.551541 Min: 2.241885
[clk-91348]: Target a latency of: 2.516026
[clk-91343]:
[clk-91353]: Increasing the delay for clkin_box_1_1_delay_0.DF
[clk-91356]: Decreasing the delay for clk_box_1_1_delay_0.DF
[clk-91353]: Increasing the delay for clkin_box_1_1_delay_0.DF
[clk-91353]: Increasing the delay for clkin_box_1_1_delay_0.DF
[clk-91343]:
[clk-91352]: Processing Level: 2 Interation: 9
[clk-91343]:
[clk-91350]: Level    Pin Name                              Max AT        Min AT        AT Mid-Point
[clk-91347]: -----------------------------------------------------------------------------------------
[clk-91351]: 2        rlm1/clkin_box_1_1_delay_0.DF         2.549275      2.466544      2.507910
[clk-91351]: 2        rlm4/clkin_box_1_1_delay_0.DF         2.305328      2.277874      2.291601
[clk-91351]: 2        clk_box_1_1_delay_0.DF                2.561445      2.468516      2.514981
[clk-91351]: 2        rlm2/clkin_box_1_1_delay_0.DF         2.539822      2.509218      2.524520
[clk-91351]: 2        rlm3/clkin_box_1_1_delay_0.DF         2.514768      2.488225      2.501496
[clk-91343]:
[clk-91348]: Non Adjustable Max: 0.000000 Min: 16.000000 - Adjustable Max: 2.533731 Min: 2.291601
[clk-91348]: Target a latency of: 2.516026
[clk-91343]:
[clk-91353]: Increasing the delay for clkin_box_1_1_delay_0.DF
[clk-91353]: Increasing the delay for clkin_box_1_1_delay_0.DF
[clk-91343]:
[clk-91352]: Processing Level: 2 Interation: 10
[clk-91343]:
[clk-91350]: Level    Pin Name                              Max AT        Min AT        AT Mid-Point
[clk-91347]: -----------------------------------------------------------------------------------------
[clk-91351]: 2        rlm1/clkin_box_1_1_delay_0.DF         2.549275      2.466544      2.507910
[clk-91351]: 2        rlm4/clkin_box_1_1_delay_0.DF         2.344259      2.316805      2.330532
[clk-91351]: 2        clk_box_1_1_delay_0.DF                2.561445      2.468516      2.514981
[clk-91351]: 2        rlm2/clkin_box_1_1_delay_0.DF         2.539822      2.509218      2.524520
[clk-91351]: 2        rlm3/clkin_box_1_1_delay_0.DF         2.550777      2.524233      2.537505
[clk-91343]:
[clk-91348]: Non Adjustable Max: 0.000000 Min: 16.000000 - Adjustable Max: 2.552057 Min: 2.330532
[clk-91348]: Target a latency of: 2.516026
[clk-91343]:
[clk-91353]: Increasing the delay for clkin_box_1_1_delay_0.DF
[clk-91356]: Decreasing the delay for clkin_box_1_1_delay_0.DF
[clk-91343]:
[clk-91352]: Processing Level: 2 Interation: 11
[clk-91343]:
[clk-91350]: Level    Pin Name                              Max AT        Min AT        AT Mid-Point
[clk-91347]: -----------------------------------------------------------------------------------------
[clk-91351]: 2        rlm1/clkin_box_1_1_delay_0.DF         2.549275      2.466544      2.507910
[clk-91351]: 2        rlm4/clkin_box_1_1_delay_0.DF         2.386749      2.359295      2.373022
[clk-91351]: 2        clk_box_1_1_delay_0.DF                2.561445      2.468516      2.514981
[clk-91351]: 2        rlm2/clkin_box_1_1_delay_0.DF         2.539822      2.509218      2.524520
[clk-91351]: 2        rlm3/clkin_box_1_1_delay_0.DF         2.514768      2.488225      2.501496
[clk-91343]:
[clk-91348]: Non Adjustable Max: 0.000000 Min: 16.000000 - Adjustable Max: 2.533731 Min: 2.373022
```

[0043]

```
[clk-91348]: Target a latency of: 2.516026
[clk-91343]:
[clk-91353]: Increasing the delay for clkin_box_1_1_delay_0.DF
[clk-91343]:
[clk-91352]: Processing Level: 2 Interation: 12
[clk-91343]:
[clk-91350]: Level    Pin Name                              Max AT       Min AT       AT Mid-Point
[clk-91347]: -------------------------------------------------------------------------------------
[clk-91351]: 2        rlm1/clkin_box_1_1_delay_0.DF         2.549275     2.466544     2.507910
[clk-91351]: 2        rlm4/clkin_box_1_1_delay_0.DF         2.424613     2.397159     2.410886
[clk-91351]: 2        clk_box_1_1_delay_0.DF                2.561445     2.468516     2.514981
[clk-91351]: 2        rlm2/clkin_box_1_1_delay_0.DF         2.539822     2.509218     2.524520
[clk-91351]: 2        rlm3/clkin_box_1_1_delay_0.DF         2.514768     2.488225     2.501496
[clk-91343]:
[clk-91348]: Non Adjustable Max: 0.000000 Min: 16.000000 - Adjustable Max: 2.533731 Min: 2.410886
[clk-91348]: Target a latency of: 2.516026
[clk-91343]:
[clk-91353]: Increasing the delay for clkin_box_1_1_delay_0.DF
[clk-91343]:
[clk-91352]: Processing Level: 2 Interation: 13
[clk-91343]:
[clk-91350]: Level    Pin Name                              Max AT       Min AT       AT Mid-Point
[clk-91347]: -------------------------------------------------------------------------------------
[clk-91351]: 2        rlm1/clkin_box_1_1_delay_0.DF         2.549275     2.466544     2.507910
[clk-91351]: 2        rlm4/clkin_box_1_1_delay_0.DF         2.464304     2.436651     2.450577
[clk-91351]: 2        clk_box_1_1_delay_0.DF                2.561445     2.468516     2.514981
[clk-91351]: 2        rlm2/clkin_box_1_1_delay_0.DF         2.539822     2.509218     2.524520
[clk-91351]: 2        rlm3/clkin_box_1_1_delay_0.DF         2.514768     2.488225     2.501496
[clk-91343]:
[clk-91348]: Non Adjustable Max: 0.000000 Min: 16.000000 - Adjustable Max: 2.533731 Min: 2.450577
[clk-91348]: Target a latency of: 2.516026
[clk-91343]:
[clk-91353]: Increasing the delay for clkin_box_1_1_delay_0.DF
[clk-91343]:
[clk-91352]: Processing Level: 2 Interation: 14
[clk-91343]:
[clk-91350]: Level    Pin Name                              Max AT       Min AT       AT Mid-Point
[clk-91347]: -------------------------------------------------------------------------------------
[clk-91351]: 2        rlm1/clkin_box_1_1_delay_0.DF         2.549275     2.466544     2.507910
[clk-91351]: 2        rlm4/clkin_box_1_1_delay_0.DF         2.503220     2.475766     2.489493
[clk-91351]: 2        clk_box_1_1_delay_0.DF                2.561445     2.468516     2.514981
[clk-91351]: 2        rlm2/clkin_box_1_1_delay_0.DF         2.539822     2.509218     2.524520
[clk-91351]: 2        rlm3/clkin_box_1_1_delay_0.DF         2.514768     2.488225     2.501496
[clk-91343]:
[clk-91348]: Non Adjustable Max: 0.000000 Min: 16.000000 - Adjustable Max: 2.533731 Min: 2.489493
[clk-91348]: Target a latency of: 2.516026
[clk-91343]:
[clk-91353]: Increasing the delay for clkin_box_1_1_delay_0.DF
[clk-91343]:
[clk-91352]: Processing Level: 2 Interation: 15
[clk-91343]:
[clk-91350]: Level    Pin Name                              Max AT       Min AT       AT Mid-Point
[clk-91347]: -------------------------------------------------------------------------------------
[clk-91351]: 2        rlm1/clkin_box_1_1_delay_0.DF         2.549275     2.466544     2.507910
[clk-91351]: 2        rlm4/clkin_box_1_1_delay_0.DF         2.545666     2.518212     2.531939
[clk-91351]: 2        clk_box_1_1_delay_0.DF                2.561445     2.468516     2.514981
[clk-91351]: 2        rlm2/clkin_box_1_1_delay_0.DF         2.539822     2.509218     2.524520
[clk-91351]: 2        rlm3/clkin_box_1_1_delay_0.DF         2.514768     2.488225     2.501496
[clk-91343]:
[clk-91348]: Non Adjustable Max: 0.000000 Min: 16.000000 - Adjustable Max: 2.533731 Min: 2.494584
[clk-91348]: Target a latency of: 2.516026
[clk-91343]:
[clk-91343]:
[clk-91348]: Completed level 2
[clk-91343]:
[clk-91352]: Processing Level: 1 Interation: 1
[clk-91343]:
[clk-91350]: Level    Pin Name                              Max AT       Min AT       AT Mid-Point
[clk-91347]: -------------------------------------------------------------------------------------
[clk-91351]: 1        rlm1/clkin_box_2_1.A                  2.582412     2.453885     2.518148
[clk-91351]: 1        clk_box_2_1.A                         2.574054     2.481820     2.527937
[clk-91351]: 1        clk_box_2_2.A                         2.573098     2.463232     2.518165
[clk-91351]: 1        clk_box_2_3.A                         2.564247     2.460787     2.512517
[clk-91351]: 1        clk_box_2_4.A:                        2.565910     2.455317     2.510613
[clk-91351]: 1        rlm2/clkin_box_2_1.A                  2.547851     2.486819     2.517335
[clk-91351]: 1        rlm3/clkin_box_2_1.A                  2.549342     2.488225     2.518783
[clk-91343]:
[clk-91348]: Non Adjustable Max: 2.527937 Min: 2.510613 - Adjustable Max: 0.000000 Min: 16.000000
[clk-91348]: Target a latency of: 0.000000
[clk-91343]:
[clk-91343]:
[clk-91348]: Completed level 1
```

What is claimed is:

1. A method for balancing signals across hierarchical entities in a design comprising the steps of:
   creating a clock tree;
   inserting a programmable delay chain into each branch of the clock tree wherein the step of inserting programmable delay chain comprises inserting one delaymux chain for each branch;
   adjusting the programmable delay chains to balance signals in levels of hierarchy in design the step of adjusting the programmable delay mux chains comprising the step of wire balancing the signals within each RLM, the step of wiring balancing also comprising an initial balancing of signals prior to completing a final routing; and
   running a parasitic extraction after completing the final design flow and performing an additional balancing of the design based on the extraction.

2. The method of claim 1 also comprising the step of fixing delay blocks for each signal branch after performing the additional balancing.

3. A method for balancing signals across hierarchical entities in a design comprising the steps of:
   creating a clock tree;
   inserting a programmable delay chain into each branch of the clock tree
   adjusting the programmable delay chains to balance signals in levels of hierarchy in the design wherein the step of adjusting the programmable delay chains comprises an initial balancing prior to completing the design flow;
   fixing the delay in the chains after the signals are balanced; and
   performing a final balancing using data from a 3D extraction.

4. A program storage device readable by machine, tangibly embodying a program of instructions executable by the machine to perform method steps for balancing signals across voltage domains in an integrated circuit design, the method comprising the steps of:
   creating a clock tree;
   inserting programmable delay chains into each branch of the clock tree wherein the step of inserting programmable delay chain comprises inserting one delaymux chain for each branch;
   adjusting the programmable delay chains to balance signals in levels of hierarchy in the design, the step of adjusting the programmable delay mux chains comprising the step of wire balancing the signals within each RLM, the step of wiring balancing also comprising an initial balancing of signals prior to completing a final routing; and
   running a parasitic extraction after completing the final design flow and performing an additional balancing of the design based on the extraction.

5. The method of claim 1 also comprising the step of fixing delay blocks for each signal branch after performing the additional balancing.

6. A program storage device readable by machine, tangibly embodying a program of instructions executable by the machine to perform method steps for balancing signals across voltage domains in an integrated circuit design, the method comprising the steps of:
   creating a clock tree;
   inserting programmable delay chains into each branch of the clock;
   adjusting the programmable delay chains to balance signals in levels of hierarchy in the design wherein the step of adjusting the programmable delay chains comprises an initial balancing prior to completing the desisin flow;
   fixing the delay in the chains after the signals are balanced; and
   performing a final balancing using data from a 3D extraction.

* * * * *